(12) United States Patent
Dean et al.

(10) Patent No.: US 6,414,489 B1
(45) Date of Patent: Jul. 2, 2002

(54) APPARATUS FOR REDUCING ACOUSTIC NOISE IN AN MR IMAGING SYSTEM

(75) Inventors: David E. Dean, Hartland; Michael J. Radziun; Scott T. Mansell, both of Waterford, all of WI (US)

(73) Assignee: General Electric Company, Waukesha, WI (US)

( * ) Notice: Subject to any disclaimer, the term of this patent is extended or adjusted under 35 U.S.C. 154(b) by 0 days.

(21) Appl. No.: 09/465,256

(22) Filed: Dec. 18, 1999

(51) Int. Cl.[7] .................................................. G01V 3/00
(52) U.S. Cl. ........................................ 324/318; 324/322
(58) Field of Search ................................ 324/318, 319, 324/320, 322, 307, 309, 300

(56) References Cited

U.S. PATENT DOCUMENTS

| | | | |
|---|---|---|---|
| 4,636,729 A | | 1/1987 | Maurer et al. ............... 324/318 |
| 4,954,781 A | * | 9/1990 | Hirata ......................... 324/318 |
| 6,252,404 B1 | * | 6/2001 | Purgill et al. ............... 324/318 |

* cited by examiner

Primary Examiner—Edward Lefkowitz
Assistant Examiner—Tiffany A. Fetzner
(74) Attorney, Agent, or Firm—Jenkens & Gilchrist

(57) ABSTRACT

Apparatus is provided for reducing the level of acoustic noise or energy which is received by an imaging subject located within the bore of an MR imaging system. The apparatus comprises a bridge fixed within the bore to support the subject during MR data acquisition, and further comprises a curved frame, usefully formed of fiberglass, which is removably insertable in the bore for placement upon the bridge. The frame, when in place upon the bridge, defines a space within the bore which is disposed to receive the imaging subject. The frame is covered by a layer of material, such as open cell foam, which is capable of absorbing substantial amounts of acoustic energy present in the bore. At the same time, the material is highly transmissive to RF signals required for MR data acquisition and avoids spurious RF signal generation which would add noise to MR data.

20 Claims, 3 Drawing Sheets

APPARATUS FOR REDUCING ACOUSTIC NOISE IN AN MR IMAGING SYSTEM

BACKGROUND OF THE INVENTION

The invention disclosed and claimed herein generally pertains to apparatus for substantially reducing the acoustic noise or disturbance which is experienced by patients, users or others in the vicinity of a magnetic resonance (MR) imaging system. More particularly, the invention pertains to apparatus of the above type wherein MR imaging is carried out by means of an MR imaging system or scanner provided with a bore, or internal imaging volume, and the apparatus includes acoustic absorbing or barrier material disposed for insertion into the bore. Even more particularly, the invention pertains to apparatus of the above type which is selectively removable from the MR system, so that it may or may not be used for a particular imaging procedure, as determined by the system operator.

As is well known by those of skill in the art, MR imaging systems employ electrically excited coils to impose time varying magnetic fields on the static primary $B_0$ field produced by the system's main magnet. The imposed fields have associated currents which flow through conductors. Since these conductors occur within a magnetic field, corresponding forces are applied to the conductors, which cause dynamic motions to be propagated through the MR system. Moreover, typical current waveforms contain repetitive pulses with fast transitions that produce vibrational energy within the audio frequency range. This causes the MR imaging system or scanner to radiate acoustic or sound pressure waves, which may be very disturbing to both patients and system operators, and may interfere with their communications. Also, very high speed scans in high field main magnets can generate noise levels which exceed acceptable exposure levels.

In the past, various schemes have been proposed to reduce the acoustic noise which is experienced by patients and others located in and around an MR scanner. However, such schemes have generally met with limited success, at best, due to severe constraints on materials which may be used within an MR scanner, and within the imaging bore. Acquisition of usable MR image data from a patient is an extremely sensitive procedure. Accordingly, no materials can be used which would distort the magnetic field waveforms required to generate MR data signals in a patient, or which would interfere with reception of the data signals by the receive coil of the MR scanner. Further constraints on acoustic noise reduction are imposed by the very limited space which is available within the coils of the scanner. This space determines the maximum diameter of the bore, or imaging volume.

SUMMARY OF THE INVENTION

The invention is generally directed to comparatively simple and inexpensive apparatus for reducing the level of acoustic noise or energy which is received by an imaging subject located within the bore of an MR imaging system. The apparatus comprises a bridge fixed within the bore to support the subject during MR data acquisition, and further comprises a frame which is removably insertable into the bore for placement upon the bridge. The frame, when in place upon the bridge, defines a space within the bore which is disposed to receive the imaging subject. The frame is covered by a layer of material which is capable of absorbing substantial amounts of acoustic energy, in the audio frequency range, which is present in the bore. At the same time, the material is highly transmissive to RF signals required for MR data acquisition and likewise avoids spurious RF signal generation which would add noise to MR data.

In a preferred embodiment of the invention, the frame comprises a rigid, selectively curved shell provided with parallel spaced-apart edges, which extend along the bridge when the shell is in place thereupon. Means joined to each of the edges of the shell are positioned between the shell and the bridge, when the shell is in place thereupon, for isolating the shell from mechanical vibrations occurring in the bridge. For example, each of the isolation means may comprise a strip of compliant material. Usefully, the shell is formed of a material such as fiberglass, and the acoustic energy absorbing material comprises open cell foam which is joined to the upper surface of the curved shell. The shell has a cross section comprising a circular arc of specified size, such as 220°.

It is anticipated that an embodiment of the invention would be particularly useful in imaging smaller patients, such as infants, children and certain elderly persons. Such patients would require less space in the imaging bore, so that correspondingly more space would be available to accommodate the frame and the acoustic absorbing material supported thereby. It is anticipated further that the invention may be embodied in a form which is highly portable, so that the embodiment of the invention may or may not be used for a particular MR imaging procedure, as determined by the system operator.

DETAILED DESCRIPTION OF THE PREFERRED EMBODIMENT

Figure 1:
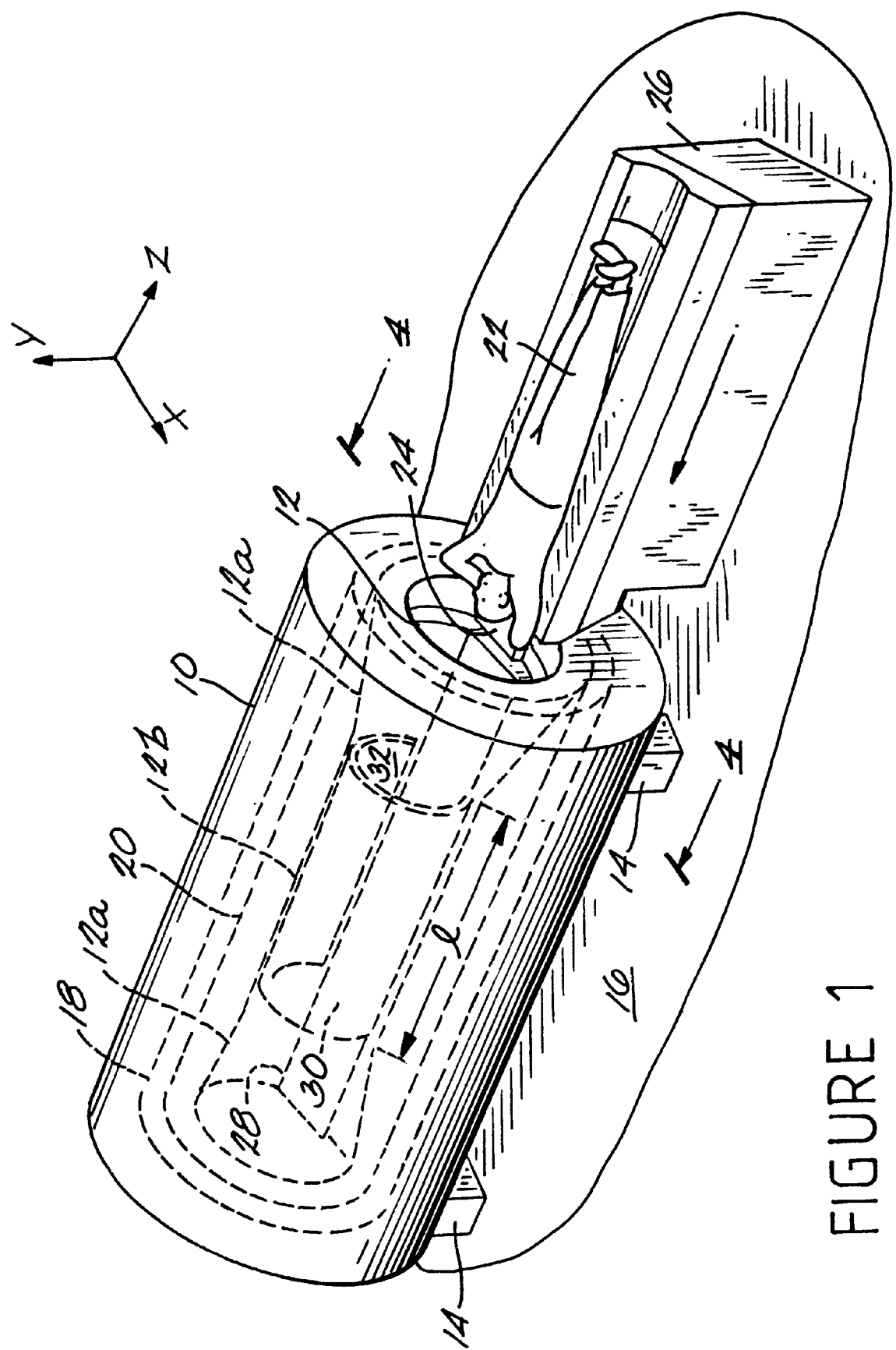
FIG. 1 is a simplified perspective view depicting certain components of an MR system associated with an embodiment of the invention.

Referring to FIG. 1, there is shown a cryostat and main magnet arrangement 10 for an MR high field imaging system. As is well known by those of skill in the art, the main magnet is positioned around a bore 12 and is contained or enclosed within the cryostat. The cryostat maintains the main magnet at an extremely low temperature. Thus, the main magnet is in a superconductive state, to produce a strong, static $B_0$ magnetic field as required for MR imaging. For brevity, cryostat and main magnet arrangement 10 are hereinafter referred to as main magnet 10. Metal legs 14 are provided to support the main magnet 10 on a floor 16, when the magnet is set up for use. The MR imaging system of FIG. 1 further includes a gradient coil assembly 18 and an RF coil assembly 20, depicted in FIG. 1 by dashed lines for simplicity. The coil assemblies are respectively positioned around bore 12, in coaxial relationship therewith and with each other. As is well known, gradient coil assembly 18 contains coils (not shown) for generating respective X-, Y-, and Z-gradient fields within the main magnet bore, as are required for MR imaging. The gradient fields are respectively oriented relative to X-, Y-, and Z-coordinate axes, wherein the Z-axis is aligned along the axis of the main magnet bore, in parallel relationship with the direction of the $B_0$ magnetic field. RF coil assembly 20 includes an RF coil or antennae for transmitting and/or receiving RF signals as required for the MR imaging process.

FIG. 1 further shows a patient or subject 22 of MR imaging positioned upon a table 24, which is in turn movably supported by a table base 26. Table 24 is disposed for movement along the Z-axis, to selectively insert patient 22 into bore 12 or to withdraw the patient therefrom. To support the patient and table within bore 12, a bridge 28, comprising a generally horizontal platform or the like, is fixed within bore 12 and extends along the lower portion thereof. When the patient 22 and table 24 are moved into the bore 12, the table engages and slides along the upper surface of bridge 28 and is supportably carried thereby. For purposes of illustration, bridge 28 is simply depicted in FIG. 1 as a flat rectangular member. However, in some designs bridge 28 is provided with a pair of rails (not shown), which extend upward from bridge 28 in parallel relationship with each other, and extend along bore 12 to engage and carry table 24.

Referring further to FIG. 1, there is shown bore 12 comprising end portions 12a and a central portion 12b. The central portion 12b has a nearly uniform or constant diameter along its length l, which is centered at the isocenter of main magnet 10. Each of the end portions 12a flares or tapers outward from an end of central bore portion 12b to an adjacent end of the main magnet.

Figure 2:
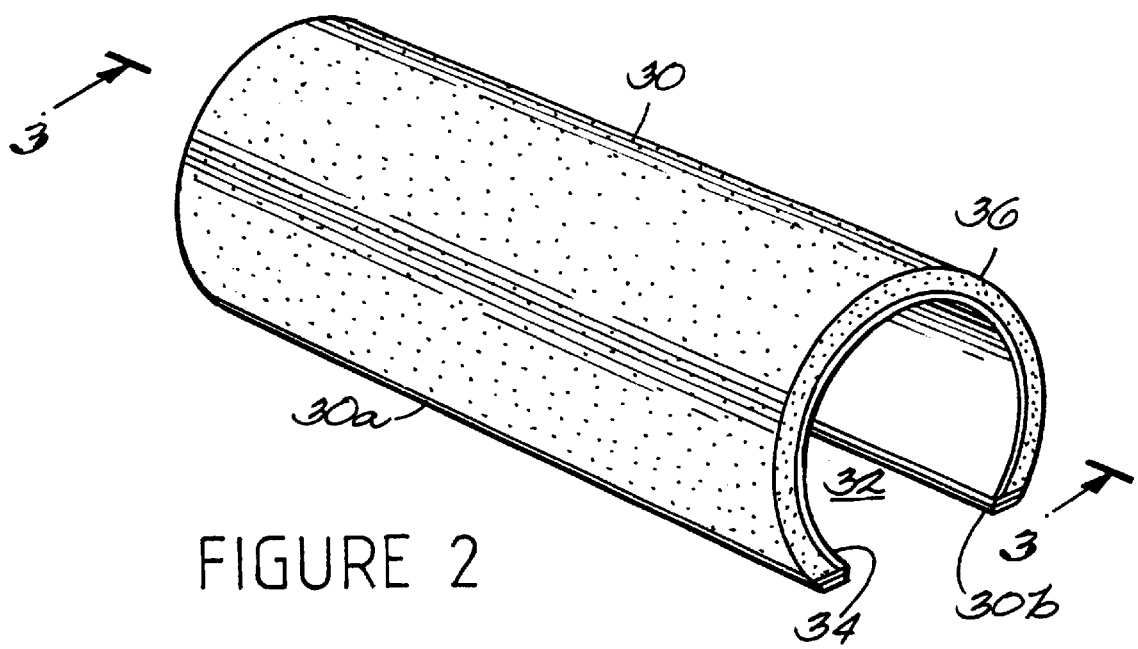
FIG. 2 is a perspective view which shows the embodiment of FIG. 1 in greater detail.
Figure 3:
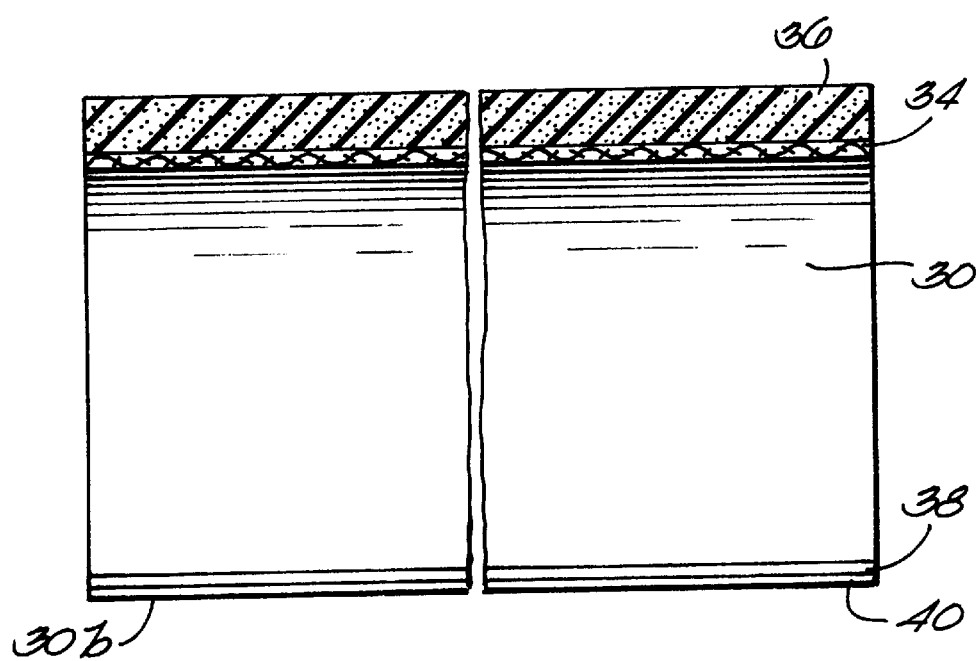
FIG. 3 is a sectional view taken along lines 3—3 of FIG. 2.

For reasons described above, a great deal of acoustic noise in the audio frequency range is projected into bore 12 when the MR system is operated to acquire image data. In order to reduce or suppress this acoustic noise, apparatus 30, comprising an embodiment of the invention, is inserted into bore 12. More particularly, the acoustic noise reducing apparatus 30, which is described hereinafter in further detail in connection with FIGS. 2 and 3, is sized for insertion along central bore portion 12b, between the upper surface of platform 28 and the wall of bore 12 which extends upward therefrom. Apparatus 30 is supported upon platform 28 and defines a space 32, between its curving lower surface and bridge 28, for receiving a patient 22 when the patient is inserted into bore 12 for imaging.

It is anticipated that, notwithstanding constraints imposed by the diameter of central bore portion 12b and the minimum thickness required for apparatus 30, space 32 would be large enough to accommodate infants, children and other small-size patients for imaging. However, the space 32 of apparatus 30 may be too small to receive certain full-size adults. Accordingly, acoustic noise reducing apparatus 30 is preferably constructed to be of very light weight, so that it may readily be inserted into and removed from bore 12 by the operator of the MR system.

Referring to FIGS. 2 and 3 together, there is shown apparatus 30 provided with parallel spaced-apart edges 30a and 30b, which engage the upper surface of bridge 28 when apparatus 30 is inserted into bore 12. As best shown by FIG. 2, apparatus 30 is further provided with a thin piece of fiberglass 34, which is selectively curved between the edges 30a and 30b to form a comparatively rigid shell or support frame 34. The fiberglass shell 34, which has a thickness on the order of 1.5 millimeters, is covered or wrapped with a layer of acoustic energy absorbing material 36, such as open cell foam. Acoustic energy absorbing layer 36 has a thickness on the order of 22–24 millimeters, and may be joined to the upper surface of fiberglass shell 34 by means of a suitable adhesive.

The material selected for layer 36 is capable of absorbing substantial amounts of acoustic energy in the audio frequency range. At the same time, such material is highly transmissive to RF and other signals which must be transmitted between patient 22 and the coils 20 and 28, in the course of acquiring MR image data, when the patient 22 is positioned in bore 12. Additionally, the material is selected to avoid RF signal generation.

Apparatus 30 is preferably constructed so that the clearance between the outer surface of layer 36 and the wall of central bore portion 12b is just sufficient to allow apparatus 30 to be easily inserted into and removed from the bore. Preferably also, apparatus 30 is provided with a length l, so that it substantially matches the dimensions of central bore portion 12b above bridge 28, and may be placed in coincident relationship therewith. When apparatus 30 is inserted into central bore portion 12b, as shown in FIG. 1, absorbing layer 36 will act to absorb substantial amounts of the acoustic energy which is projected into bore 12 by operation of coils 18 and 20, during acquisition of MR image data as previously described. By placing apparatus 30 within bore 12, the level of acoustic noise experienced by a patient 22 therein, as well as by an operator or others proximate to the MR imaging system, may be reduced by 50% or more.

As best shown by FIG. 3, strips of compliant material 38, such as rubber or the like, are joined to each of the lower edges of the fiberglass shell 34, as viewed in FIG. 2, to extend along each of the edges 30a and 30b. Thus, compliant strips 38 are positioned between the fiberglass shell 34 and the bridge 28, when apparatus 30 is placed thereupon, to mechanically isolate the fiberglass shell 34 from any vibrations occurring within the bridge 28. Usefully, means such as teflon tape 40 are placed on the undersides of the compliant strips 38, to enable apparatus 30 to slide easily along the top of bridge 28.

Figure 4:
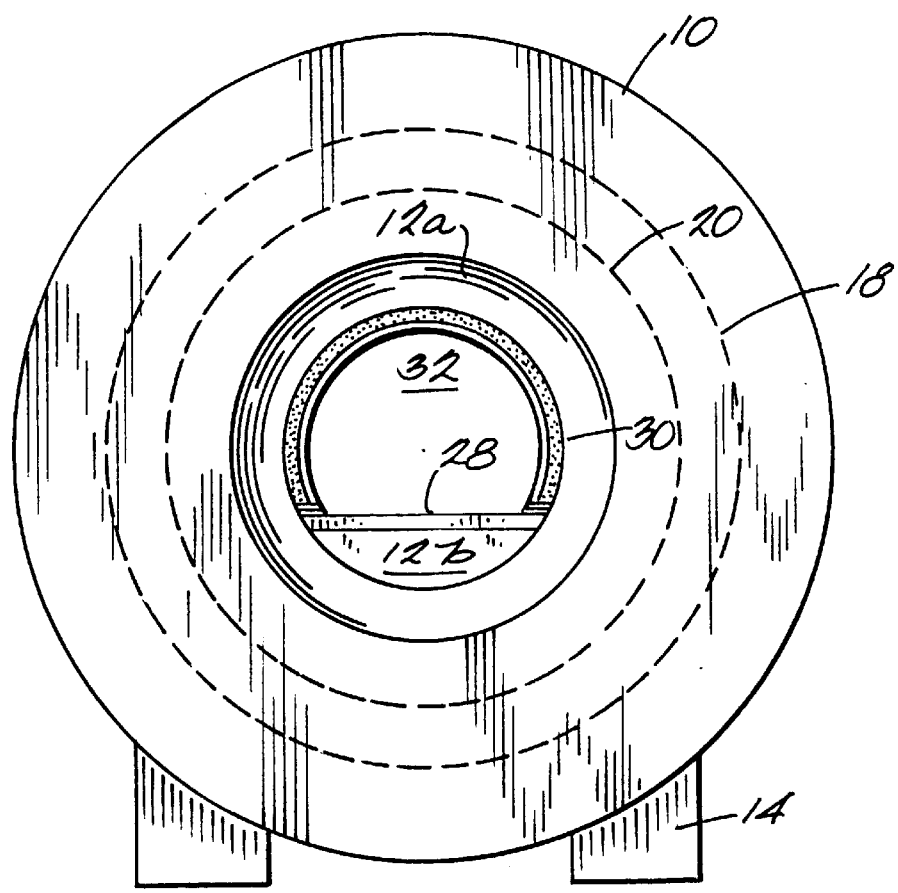
FIG. 4 is an end view taken along lines 4—4 of FIG. 1.

Referring to FIG. 4, there is shown apparatus 30 having a cross section which comprises a circular arc of specified diameter. Usefully, the circular arc is selected to be on the order of 220 degrees, to optimize the space 32 within apparatus 30.

Figure 5:
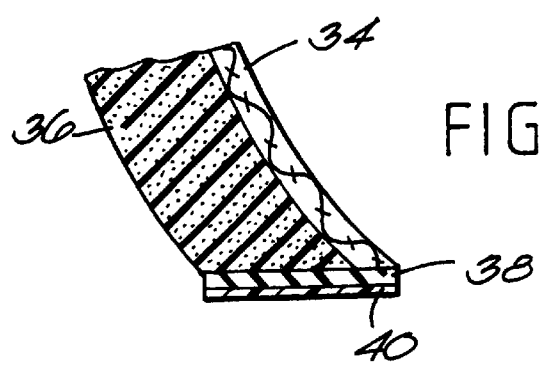
FIG. 5 is a sectional view showing a portion of the embodiment shown in FIG. 4 in greater detail.

Referring to FIG. 5, a lower portion of the apparatus 30 of FIG. 4 is shown in greater detail. FIG. 5 further illustrates a compliant strip 38 and teflon tape 40.

Obviously, many modifications and variations of the present invention are possible in light of the above teachings. It is therefore to be understood that within the scope of the disclosed concept, the invention may be practiced otherwise than as has been specifically described.

What is claimed is:

1. In an MR imaging system provided with an imaging volume disposed to receive a subject for acquisition of MR data, a removably insertable apparatus for reducing acoustic noise associated with operation of the MR system comprising, a substantially horizontal platform fixed within said imaging volume to support said subject during MR data aquisition;

a frame which is removably insertable into said imaging volume for placement upon said platform, said frame, when in place upon said platform, defining a space within said imaging volume which is disposed to receive said imaging subject, at least a portion of said frame comprising a cylindrical section immediately surrounding a received subject, and a layer of material attached to said removably insertable frame, said material being insertable into said imaging volume with said fame and capable of absorbing substantial amounts of acoustic energy in the audio frequency range which is present in said imaging volume, said material also being highly transmissive to RF signals required for said MR data acquisition.

2. The apparatus of claim 1 wherein:

said frame comprises a rigid, selectively curved shell provided with parallel spaced-apart edges which extend along said platform when said shell is in place thereupon.

3. The apparatus of claim 2 wherein said apparatus further comprises:

means joined to each of said edges of said shell and positioned between said shell and said platform, when said shell is in place thereupon, for isolating said shell from mechanical vibrations occurring in said platform.

4. The apparatus of claim 3 wherein:

each of said isolation means comprises a strip of compliant material.

5. The apparatus of claim 4 wherein:

said shell is curved to substantially match the curvature of a portion of a wall defining said imaging volume which is adjacent to said apparatus when said shell is in place upon said platform; and said acoustic energy absorbing material is positioned between said shell and said portion of said wall, a slight clearance being provided therebetween.

6. The apparatus of claim 5 wherein:

said shell is formed of fiberglass.

7. The apparatus of claim 6 wherein:

said acoustic energy absorbing material comprises open cell foam.

8. The apparatus of claim 3 wherein said imaging volume comprises a central portion of specified length and constant diameter and end portions respectively tapering outward from said central portion, said central portion being centered at the isocenter of said MR system; and said apparatus has a length equal to said specified length of said central portion, and is disposed for insertion into said central portion, in closely spaced relationship with the wall thereof, when said shell is in place upon said platform.

9. The apparatus of claim 3 wherein:

said shell has a cross section comprising a circular arc of specified size.

10. The apparatus of claim 9 wherein:

said circular arc is on the order of 220°.

11. In an MR imaging system provided with an imaging volume disposed to receive a subject for acquisition of MR data, and further provided with a substantially horizontal platform structure to support said subject within said imaging volume during MR data acquisition, a removably insertable apparatus for reducing acoustic noise associated with operation of the MR system comprising:

a frame which is removably insertable into said imaging volume for placement upon said support structure structure, when inserted, defining a space in said imaging volume between said frame and said support structure which is disposed to receive said imaging subject, at least a portion of said frame comprising a cylindrical section immediately surrounding a received subject; and a layer of material attached to said frame and disposed for removable insertion into said imaging volume with said frame, said material being capable of absorbing substantial amounts of acoustic energy in the audio frequency range which is present in said imaging volume, said material also being highly transmissive to RF signals required for said MR data acquisition.

12. The apparatus of claim 11 wherein:

said support structure comprises a platform; and said layer of acoustic energy absorbing material is further selected to avoid RF signal generation.

13. The apparatus of claim 12 wherein:

said frame comprises a rigid, selectively curved shell provided with parallel spacedpart edges which extend along said platform structure when said shell is in place thereupon.

14. The apparatus of claim 13 wherein said apparatus further comprises:

a strip of compliant material joined to each of said edges of said shell and positioned between said shell and said platform structure, when said shell is in place thereupon, for isolating said shell from mechanical vibration occurring in said platform structure.

15. The apparatus of claim 14 wherein:

said shell is curved to substantially match the curvature of a portion of a wall defining said imaging volume which is adjacent to said apparatus when said shell is in place upon said platform structure; and said acoustic energy absorbing material is positioned between said shell and said portion of said wall, a slight clearance being provided therebetween.

16. The apparatus of claim 15 wherein:

said shell is formed of fiberglass.

17. The apparatus of claim 16 wherein:

said acoustic energy absorbing material comprises open cell foam.

18. The apparatus of claim 13 wherein:

said imaging volume comprises a central portion of specified length and constant diameter and end portions respectively tapering outward from said central portion, said central portion being centered at the isocenter of said MR system; and said apparatus has a length equal to said specified length of said central portion, and is disposed for insertion into said central portion in closely spaced relationship with the wall thereof, when said shell is in place upon said platform structure.

19. The apparatus of claim 13 wherein:

said shell has a cross section comprising a circular arc of specified size.

20. The apparatus of claim 19 wherein:

said circular arc is on the order of 220°.

* * * * *